United States Patent
Eussen et al.

(10) Patent No.: US 7,283,249 B2
(45) Date of Patent: Oct. 16, 2007

(54) LITHOGRAPHIC APPARATUS AND A METHOD OF CALIBRATING SUCH AN APPARATUS

(75) Inventors: Emiel Jozef Melanie Eussen, Eindhoven (NL); Johannes Mathias Theodorus Antonius Adriaens, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 253 days.

(21) Appl. No.: 11/101,629

(22) Filed: Apr. 8, 2005

(65) Prior Publication Data

US 2006/0227332 A1    Oct. 12, 2006

(51) Int. Cl.
  *G01B 11/02*    (2006.01)
(52) U.S. Cl. ..................................... 356/500
(58) Field of Classification Search ................ 356/496, 356/498, 500, 614; 250/559.29; 355/53
See application file for complete search history.

(56) References Cited

U.S. PATENT DOCUMENTS 4,509,852 A    4/1985    Tabarelli et al.
6,020,964 A *  2/2000   Loopstra et al. ............ 356/500
7,016,049 B2 * 3/2006   Kurosawa .................... 356/508
2005/0190375 A1 * 9/2005 Akimoto ...................... 356/500

FOREIGN PATENT DOCUMENTS

EP    1 420 300 A2    5/2004
WO    WO99/49504     9/1999

* cited by examiner

*Primary Examiner*—Michael A. Lyons
(74) *Attorney, Agent, or Firm*—Pillsbury Winthrop Shaw Pittman LLP

(57) ABSTRACT

A lithographic apparatus includes an object support configured to support an object. The apparatus further includes X, Y and Z interferometer measurement systems, and an object support positioning system configured to position the object support in a number of degrees of freedom on the basis of measurements of the interferometer measurement systems. A calibration device is configured to measure Ry of the object support with the X interferometer measurement system in at least two different Z positions, measure Ry of the object support with the Z interferometer measurement system in at least two different Z positions, calibrate a linear Z dependency of Ry on the basis of the measurements, and calibrating a linear X dependency of Z on the basis of the previous calibration. Similarly, a linear Y dependency of Z is calibrated.

18 Claims, 3 Drawing Sheets

LITHOGRAPHIC APPARATUS AND A METHOD OF CALIBRATING SUCH AN APPARATUS

BACKGROUND

1. Field of the Invention

The present invention relates to a lithographic apparatus and a method for calibrating a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system, i.e. the bottom of the projection system, and the substrate. This enables more accurate projections and imaging of smaller features since the exposure radiation will have a shorter wavelength in the liquid. The effect of the immersion liquid may be regarded as increasing the effective numerical aperture number NA of the system and also increasing the depth of focus. Other immersion liquids have been proposed, including water with solid particles (e.g. quartz) suspended therein. Thus, a lithographic apparatus may be provided with a fluid provider (also referred to as an immersion head) which is arranged to provide the immersion liquid, or to keep the liquid in its place. The liquid may be flowing to avoid local heating.

The substrate, or the substrate and the substrate table, may be immersed in a bath of immersion liquid. An example of such an arrangement is disclosed in U.S. Pat. No. 4,509,852 which hereby is incorporated by reference in its entirety. Alternatively, the immersion liquid may be provided by a liquid supply system only on a localized area of the substrate and in between the final element of the projection system and the substrate using a liquid confinement system, the substrate generally having a larger surface area than the final element of the projection system. An example of such an arrangement is disclosed in International Patent Application No. 99/49,504 which hereby is incorporated by reference in its entirety. The liquid is supplied by at least one inlet on the substrate, preferably along a direction of movement of the substrate relative to the final element of the projection system, and the liquid is discharged by at least one outlet which may be connected to a low pressure source. Various orientations and numbers of inlets and outlets positioned near the periphery of the final element are possible. Further, a liquid supply system may be provided with a seal member which extends along at least a part of a boundary of a space between the final element of the projection system and the substrate table. The seal member is substantially stationary relative to the projection system in the XY plane of an XYZ system of coordinates, though there may be some relative movement in the Z direction (the direction of the optical axis of the projection system). A seal is formed between the seal member and the surface of the substrate. The seal may be a contactless seal such as a gas seal, which may further function as a gas bearing. An example of such an arrangement is disclosed in European Patent Application No. 03252955.4, which hereby is incorporated by reference in its entirety.

European Patent Application No. 03257072.3, which hereby is incorporated by reference in its entirety, discloses a twin or dual stage immersion lithography apparatus. Such an apparatus is provided with two stages for supporting the substrate. Leveling measurements are carried out with a stage at a first position, without the presence of an immersion liquid, and exposure is carried out with a stage at a second position, where an immersion liquid is present. Alternatively, the apparatus has only one stage.

In lithographic apparatuses of the types described above, an interferometer system may be used for measuring the position and displacement of an object, such as a substrate or a mask, in a plane which is parallel to the XY plane, by X and Y measuring mirrors which are arranged on a holder or object table, such as a substrate table or a mask table, carrying the object. The system includes a generator which generates a plurality of measuring beams and directs the measuring beams along a plurality of measuring axes which are parallel to the XY plane and extend to and from the measuring mirrors, and radiation-sensitive detectors which convert measuring beams reflected by measuring mirrors into electric measuring signals which include information about the X and Y position of the object. The number of X and Y measuring axes is at least equal to the number of object movements to be measured interferometrically. Further, Z measuring mirrors are arranged on the holder of the object at an angle to the XY plane, to which end the interferometer system has a Z measuring axis and is provided with a generator which generates a Z measuring beam and directs the measuring beam onto the Z measuring mirror, and a Z detector for converting the Z measuring beam from the Z measuring mirror into an electric measuring signal which comprises information about the Z position of the object. The lithographic apparatus may further include a metrology frame supporting Z reference mirrors essentially extending in the XY plane. Alternatively, such Z reference mirrors may be secured to a holder of the projections lens system. Further details of the interferometer system for determining the X, Y and Z positions of an object holder of an object are disclosed in U.S. Pat. No. 6,020,964 which hereby is incorporated by reference in its entirety.

A calibration of the interferometer system for the Z direction includes a calibration of the linear Z dependency on X, also referred to as the sensitivity pzx. Conventionally, this calibration is performed by projecting an image in air between the projection system and the substrate, while adapting the Z position with a substrate table positioning system to obtain a measuring signal at two different positions, as viewed in the X direction. As an example, a sensor to be used for this calibration may be a Transmission Image Sensor (TIS) measuring through the projection system. The TIS enables a fine calibration of the Z interferometer, provided that the substrate table is located within a predetermined Z range, which is obtained in a coarse calibration. The TIS will have been adjusted to measuring in a wet condition, i.e. in the presence of an immersion liquid between the final element of the projection system and the substrate.

Typically, one of the Z reference mirrors may not be aligned to the other, and/or one or both of the Z reference mirrors may not extend at right angles to the Z direction. A reason for such an offset may be initial alignment (in)accuracy, initial adjustment (in)accuracy, inadvertent touching, shock or collision of the Z reference mirrors or the metrology frame on which they may be mounted, e.g. during maintenance. As a result, in the X dependency of Z, which may be expressed as $$Z = pzx * X + \ldots$$

(where pzx, a parameter for the linear X dependency, may be seen as indicating the average offset angle of the Z reference mirrors), the value of pzx is uncalibrated. In an immersion type lithographic apparatus, unacceptable Z error may occur when the measuring system is influenced by the offset Z reference mirrors and pzx is uncalibrated. This may cause unexpected widening or narrowing of the layer of immersion liquid. On the other hand, a calibration of pzx can only be performed in a wet condition, e.g. using the TIS. Thus, on the one hand pzx can only be calibrated by going to the wet condition, but on the other hand pzx must be calibrated at least coarsely before going to the wet condition.

SUMMARY

It is desirable to provide a coarse calibration of the linear X dependency of Z, in particular in, but not restricted to an immersion type lithographic apparatus.

In an embodiment of the invention, a lithographic apparatus includes:
an object support configured to support an object;
an interferometer measurement system including an X interferometer measurement system which measures in an X direction of an XYZ coordinate system, a Y interferometer measurement system which measures in a Y direction of the XYZ coordinate system, and a Z interferometer measurement system which measures in a Z direction of the XYZ coordinate system;
an object support positioning system which positions the object support in a number of degrees of freedom on the basis of measurements of the interferometer measurement system; and
a calibration device configured to:
(a) measure Ry of the object support with the X interferometer measurement system in at least two different Z positions;
(b) measure Ry of the object support with the Z interferometer measurement system in at least two different Z positions;
(c) calibrate a linear Z dependency of Ry on the basis of the measurements according to steps (a) and (b); and
(d) calibrate a linear X dependency of Z on the basis of the calibration according to step (c).

A lithographic apparatus in accordance with an embodiment of the invention includes:
(1) an object support configured to support an object;
(2) an interferometer measurement system including an X interferometer measurement system configured to measure a position of the object support in an X direction of an XYZ coordinate system, a Y interferometer measurement system configured to measure a position of the object support in a Y direction of the XYZ coordinate system, and a Z interferometer measurement system configured to measure a position of the object support in a Z direction of the XYZ coordinate system;
(3) an object support positioning system configured to position the object support in a number of degrees of freedom based on measurements of the interferometer measurement system; and
(4) a calibration device configured for:
(a) measuring a rotation Ry of the object support about the Y direction with the X interferometer measurement system in at least two different Z positions;
(b) measuring a rotation Ry of the object support about the Y direction with the Z interferometer measurement system in at least two different Z positions;
(c) calibrating a linear Z dependency of Ry on the basis of measurements of the rotation Ry with the X interferometer measurement system and the rotation Ry with the Y interferometer measurement system; and
(d) calibrating a linear X dependency of Z on the basis of the calibrating of the linear Z dependency of Ry.

In the apparatus according to embodiments of the present invention, in the presence of tilted Z reference mirrors, a coarse calibration of the linear X dependency of Z can be made using available redundancy in Ry, as will be explained below. The different Z positions used for the measurement of step (a) may be the same as the different Z positions used for the measurement of step (b), so that these measurements may be performed (virtually) simultaneously. It should be noted that the measurement of step (a) may also be performed using an other measurement system in stead of the X-interferometer measurement system. In case the apparatus is equipped with a level sensor for measuring the Z-displacement, this sensor may equally be applied to perform the measurement of step (a).

In an embodiment of the present invention, the calibration device is further configured to obtain in step (d) a parameter representing the linear X dependency of Z by multiplying a parameter representing the linear Z dependency of Ry according to step (c) with a factor. In general, the factor depends from the geometry of the object support. In a further embodiment of the invention, the factor is L/2, wherein L is a dimension of the object support in the X direction.

In an embodiment of the invention, the calibration device is further configured to:
(e) measure Ry of the object support with the X interferometer measurement system in at least two different X positions;
(f) measure Ry of the object support with the Z interferometer measurement system in at least two different X positions;
(g) calibrate a linear X dependency of Ry on the basis of the measurements according to steps (e) and (f).

In an embodiment of the invention, the calibration device is further configured to:
(e) measuring a rotation Ry of the object support about the Y direction with the X interferometer measurement system in at least two different X positions;
(f) measuring a rotation Ry of the object support about the Y direction with the Z interferometer measurement system in at least two different X positions; and
(g) calibrating a linear X dependency of Ry on the basis of the measuring of the rotation Ry with the X interferometer measurement system and the measuring of the rotation Ry with the Z interferometer measurement system.

A parameter representing the linear X dependency of Ry obtained in the steps described above, indicates a tilt difference between Z reference mirrors, and can be used to monitor any changes in said tilt difference by performing the calibration steps (e)-(g) repeatedly.

Instead of measuring Ry with the X interferometer measurement system and the Z interferometer measurement system according to steps (a) and (b), calibrating a linear Z dependency of Ry according to step (c), and calibrating a linear X dependency of Z according to step (c), as an alternative also Rx may be measured with the Y interferometer measurement system and the Z interferometer measurement system, a linear Z dependency of Rx may be calibrated, and a linear Y dependency of Z may be calibrated. In the latter case, the calibration device may be further configured to obtain a parameter representing the linear Y dependency of Z by multiplying a parameter representing the linear Z dependency of Rx with a factor, which in an aspect may be L/2, wherein L is a dimension of the object support in the Y direction. Also in this case, for monitoring a tilt difference between Z reference mirrors, instead of measuring Ry with the X interferometer measurement system and the Z interferometer measurement system according to steps (e) and (f), and calibrating a linear X dependency of Ry according to step (g), as an alternative also Rx may be measured with the Y interferometer measurement system and the Z interferometer measurement system, and a linear Y dependency of Rx may be calibrated.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
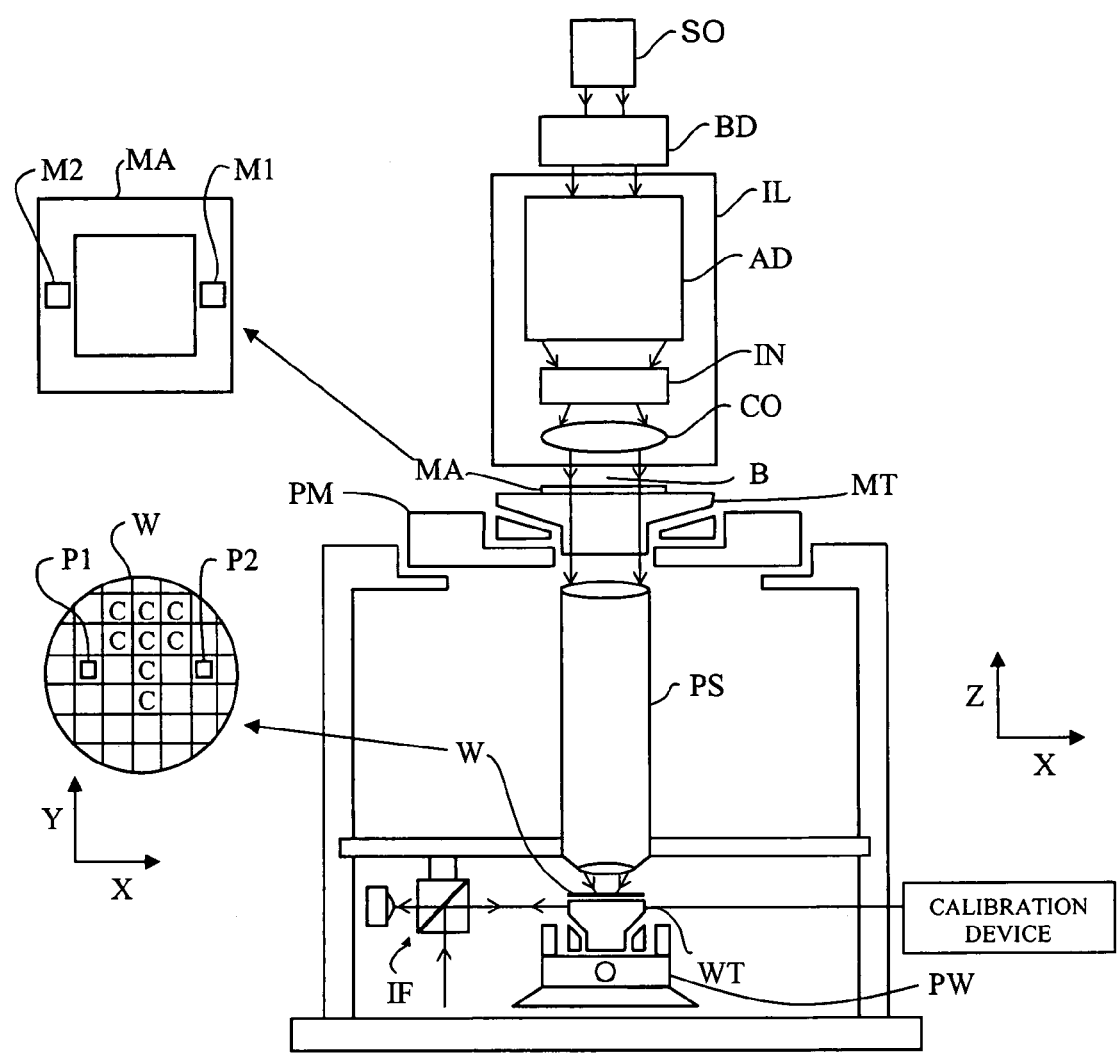
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first postioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines, the additional tables or supports may be used in parallel, or preparatory steps may be carried out on one or more tables or supports while one or more other tables or supports are being used for exposure.

As explained above, the lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery systems BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT or "mask support" and the substrate table WT or "substrate support" are kept essentially stationary, while an entire pattern imparted to the radiation beam is projected onto a target portion C at once (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

Scan mode: the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In a lithographic apparatus, the position of an object holder, such as a mask table MT or a substrate table WT, is determined in six degrees of freedom: X, Y, Z, Rx, Ry, and Rz with the aid of a system including interferometers for a number of degrees of freedom. In the Z and Ry determination with the so-called Z interferometers (referred to as Z and Ryz), the two Z reference mirrors play an important role. Both Z reference mirrors may be characterized by a constant Z shift and an angle in Ry. This is explained in further detail by reference to FIGS. 2, 3, and 4.

Figure 2:
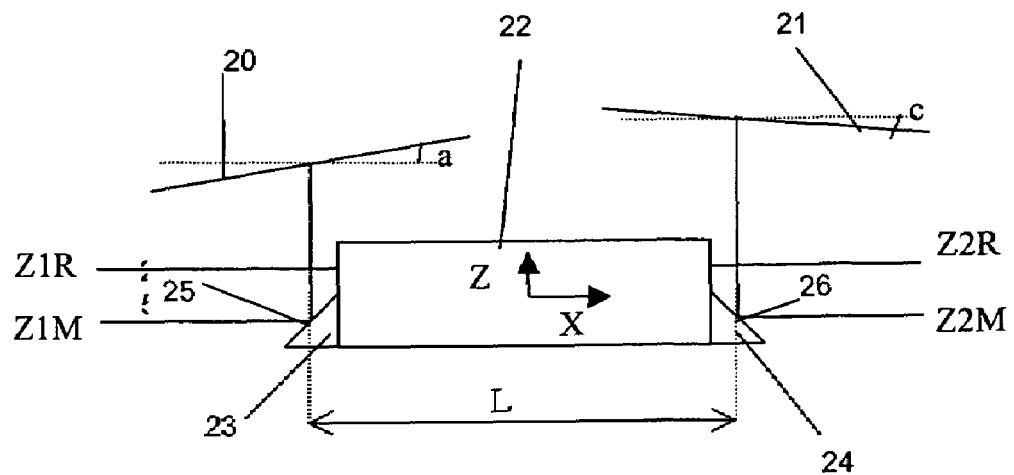
FIG. 2 schematically depicts a side view of a movable object table (substrate table or mask table) of the lithographic apparatus in accordance with an embodiment of the invention, and indicates Z interferometer measurements performed on the object table.

FIG. 2 shows, in a schematic side view, a first Z reference mirror 20, a second Z reference mirror 21, and a substrate table 22 having a first Z measurement mirror 23 and a second Z measurement mirror 24. It is assumed that a support surface of the substrate table 22 extends in the XY plane of a XYZ system of coordinates. With the substrate table 22 in a certain position relative to the first Z reference mirror 20 and the second Z reference mirror 21, a first Z interferometer measurement beam Z1M measures a Z position Z1 from the substrate table 22 to the first Z reference mirror 20 via the first Z measurement mirror 23, and a second Z interferometer measurement beam Z2M measures a Z position Z2 from the substrate table 22 to the second Z reference mirror 21 via the second Z measurement mirror 24. A distance between a first point of impact 25 of the measurement beam Z1M on the first Z measurement mirror 23 and a second point of impact 26 of the measurement beam Z2M on the second Z measurement mirror 24 is indicated as L. A direction of rotation around the Y axis is indicated by Ry (not shown). A first Z reference beam and a second Z reference beam are indicated as Z1R and Z2R, respectively.

The first Z reference mirror 20 is assumed to be tilted to have a directional coefficient a relative to a horizontal plane indicated as a dashed line. Likewise, the second Z reference mirror 21 is assumed to be tilted to have a directional coefficient c relative to a horizontal plane indicated as a dashed line.

Figure 3:
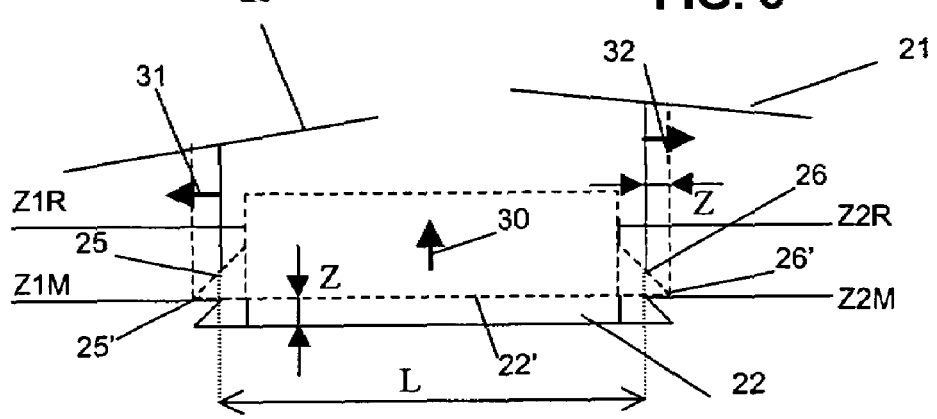
FIG. 3 schematically depicts the object table of FIG. 2, and indicates Z interferometer measurements performed on the object table with a displacement in the Z direction.

Referring to FIG. 3, a displacement of object table 22 in the Z direction of arrow 30 to a position indicated with dashed lines 22' will lead to a displacement of the first point of impact 25 to a first point of impact 25' of the measurement beam Z1M on the first Z measurement mirror 23 in the direction of arrow 31. Also, a point of impact of the measurement beam Z1M on the (assumedly non-horizontal) first Z reference mirror 20 is displaced in the direction of arrow 31, leading to a change of distance measured between the point of impact 25' and the first Z reference mirror 20. The second point of impact 26 of the measurement beam Z2M on the second Z measurement mirror 24 will be displaced in the direction of arrow 32 to a second point of impact 26'. Also, a point of impact of the measurement beam Z2M on the (assumedly non-horizontal) second Z reference mirror 21 is displaced in the direction of arrow 32, leading to a change of distance measured between the point of impact 26' and the second Z reference mirror 21. The displaced first and second points of impact 25' and 26', respectively, and the displaced points of impact of the measurement beams Z1M, Z2M on the first and second Z reference mirrors 20 and 21, respectively, thus influence the distance measured by the measurement beams Z1M and Z2M. The distances measured by the first reference beam Z1R and the second reference beam Z2R do not change with a displacement of the object table 22 in the Z direction.

Figure 4:
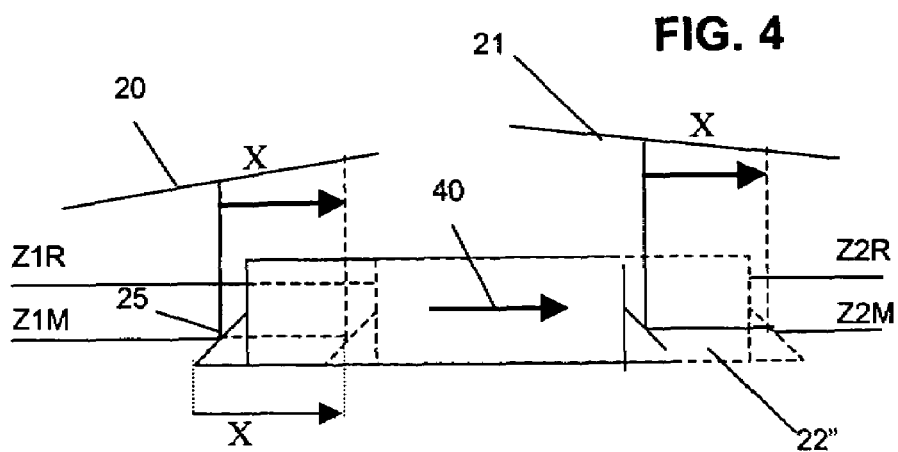
FIG. 4 schematically depicts the object table of FIG. 2, and indicates Z interferometer measurements performed on the object table with a displacement in the X direction.

Referring to FIG. 4, a displacement of object table 22 in the X direction of arrow 40 to a position indicated with dashed lines 22" will not lead to a displacement of the first point of impact 25 of the measurement beam Z1M on the first Z measurement mirror 23, although the distance measured by the measurement beam Z1M changes. At the same time, a point of impact of the measurement beam Z1M on the (assumedly non-horizontal) first Z reference mirror 20 is displaced in the direction of arrow 40, leading to a change of distance measured between the point of impact 25 and the first Z reference mirror 20. The second point of impact of the measurement beam Z2M on the second Z measurement mirror 24 will not be displaced by the displacement of object table 22 in the direction of arrow 40, although the distance measured by the measurement beam Z2M changes. At the same time, a point of impact of the measurement beam Z2M on the (assumedly non-horizontal) second Z reference mirror 21 is displaced in the direction of arrow 40, leading to a change of distance measured between the point of impact 26 and the second Z reference mirror 21. Thus, the displacement of the object table 22 in the direction of arrow 40 influences the distances measured by the measurement beams Z1M and Z2M. The distances measured by the first reference beam Z1R and the second reference beam Z2R also change with a displacement of the object table 22 in the X direction.

On the basis of the above, the (basic) model equations for a change of the interferometer axes as a function of X and Z (not indicating constant or higher order terms) are:

$$Z1M = X + aX - Z - aZ + \ldots$$

$$Z1R = X + \ldots$$

$$Z2M = -X + cX - Z + cZ + \ldots$$

$$Z2R = -X + \ldots$$

The Z1 and Z2 measurements are the length difference between the measurement beams Z1M, Z2M and the associated reference beams Z1R, Z2R, respectively, since an interferometer system is a differential measurement system. Thus:

$$Z1 = Z1M - Z1R = aX - Z - aZ + \ldots$$

$$Z2 = Z2M - Z2R = =cX - Z + cZ + \ldots$$

It will be clear that a Z measurement model is dominated by an average of Z1 and Z2. Using the above equations, the following relationship may be established:

$$\frac{Z1 + Z2}{2} = \frac{a+c}{2}X - Z - \frac{a-c}{2}Z + \ldots$$

The latter relationship may be rewritten as an equation for Z:

$$Z = -\frac{Z1 + Z2}{2} = \frac{a+c}{2}X - \frac{a-c}{2}Z + \ldots$$

The parameter for the linear X dependency, which represents in fact the average tilt of the first and the second Z reference mirrors 20, 21, can be denoted pzx (parameter for X dependency in Z measurement). It is noted that the term with Z is effectively a scaling for Z, which is further neglected. The following equation [1] results:

$$Z = \frac{Z1 + Z2}{2} + pzX + \ldots \qquad [1]$$

It is desirable to calibrate pzx=(a+c)/2, because leaving this parameter uncalibrated may cause large Z position errors as a function of X (see equation [1]).

Simultaneously, the difference between Z1 and Z2 divided by L can be used as Ry measurement. This measurement is referred to Ryz (Ry measured with Z interferometers):

$$Ryz = \frac{Z1 - Z2}{L} \qquad [2]$$

$$= \frac{a-c}{L}X - \frac{a+c}{L}Z + \ldots$$

It is noted that parameter pzx (with a factor) also appears in the model for Ryz:

$$(a+c)/L = 2/L * (a+c)/2 = 2/L * pzx$$

Figure 5:
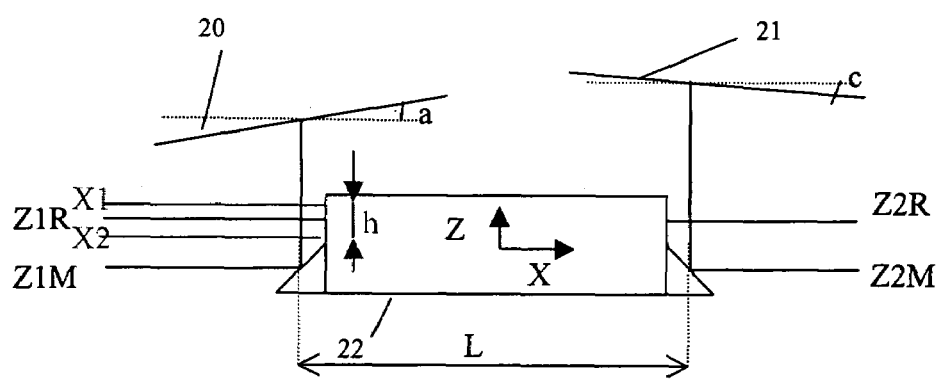
FIG. 5 schematically depicts the object table of FIG. 2, and indicates X and Z interferometer measurements performed on the object table.
Figure 6:
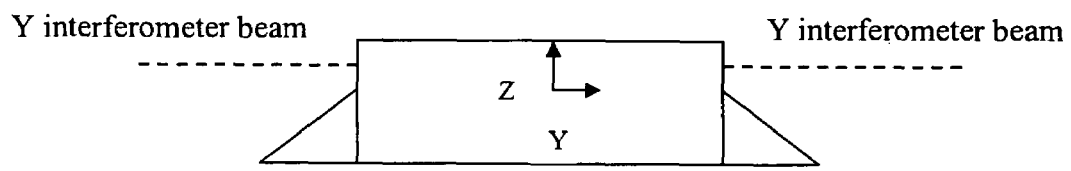
FIG. 6 schematically depicts the object table of FIG. 2, and indicates the Y interferometer measurement performed on the object table.

It is further noted that a second Ry measurement is available using the X interferometers. Referring to FIG. 5, a rotation around the Y axis may be measured using a first X measurement beam X1 and a second X measurement beam X2 having a known distance h between each other. Thus, the measurement model for Ry measured with the X interferometers, which is referred to as Ryx, is dominated by:

$$Ryx = \frac{X1 - X2}{h} + \ldots$$

It is noted that, given the layout of the X interferometer beams, the Ryx measurement is insensitive to a Z displacement of the object table 22.

Therefore, by moving in Z and comparing Ryx and Ryz, the parameter (a+c)/L from the Ryz model can be calibrated. In other words, by using the factor 2/L the average tilt of the first and the second Z reference mirrors 20, 21, i.e., the parameter pzx, can be coarsely calibrated by a calibration device shown in FIG. 1 configured for this task.

It will be appreciated that such coarse calibration can be performed without using sensors that use the lens and without having to add new sensors. Instead, the available redundancy in Ry is used to coarsely calibrate a parameter of the Z model. This is particularly useful in, but not limited to an immersion type lithographic apparatus.

It is to be observed that this calibration methodology can also be used as verification method. Given the layout of the X interferometer beams as shown in FIG. 5, the Ryx measurement is insensitive to an X displacement of the object table 22. Therefore, by moving in the X direction and comparing Ryx and Ryz, the parameter (a–c)/L of the Ryz can be calibrated (see equation [2]). If this parameter is multiplied by L, the tilt difference of the first and second Z reference mirrors 20, 21 is obtained. Thus, the calibration may also be used as a very fast check for any changes of the tilt difference. For this purpose, the coarse calibration described above preferably is performed more than once to monitor the tilt difference of the Z reference mirrors 20, 21. This monitoring may take place continuously to observe any changes in the tilt difference.

It is further observed that a pure translation of the first Z reference mirror 20 or the second Z reference mirror 21 will not result in any difference since the interferometer system is an incremental system, and the absolute positions of the first and second Z reference mirrors 20, 21 are eliminated during zeroing.

Although in the above description a method and device for coarse calibration of a linear X dependency of Z has been described, a similar method and device may be used to perform a coarse calibration of a linear Y dependency of Z based on Rxy and Rxz, measuring with the Z and Y interferometers of an interferometer measurement system.

Although specific reference maybe made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   (a) an object support configured to support an object;
   (b) an interferometer measurement system including an X interferometer measurement system configured to measure a position of said object support in an X direction of an XYZ coordinate system, a Y interferometer measurement system configured to measure a position of said object support in a Y direction of the XYZ coordinate system, and a Z interferometer measurement system configured to measure a position of said object support in a Z direction of the XYZ coordinate system;
   (c) an object support positioning system configured to position the object support in a number of degrees of freedom based on measurements of the interferometer measurement system; and (d) a calibration device configured to:
  (i) measure a rotation Ry of the object support about the Y direction with the X interferometer measurement system in at least two different Z positions;
  (ii) measure a rotation Ry of the object support about the Y direction with the Z interferometer measurement system in at least two different Z positions;
  (iii) calibrate a linear Z dependency of Ry on the basis of measurement of the rotation Ry with the X interferometer measurement system and measurement of the rotation Ry with the Z interferometer measurement system; and
  (iv) calibrate a linear X dependency of Z on the basis of calibration of the linear Z dependency of Ry.

2. The apparatus of claim 1, wherein the calibration device is further configured to obtain a first parameter representing said linear X dependency of Z by multiplying a second parameter representing said linear Z dependency of Ry with a factor.

3. The apparatus of claim 2, wherein the factor is L/2, wherein L is a dimension of the object support in the X direction.

4. The lithographic apparatus of claim 1, wherein the calibration device is further configured to:
  (a) measure a rotation Ry of the object support about the Y direction with the X interferometer measurement system in at least two different X positions;
  (b) measure a rotation Ry of the object support about the Y direction with the Z interferometer measurement system in at least two different X positions; and
  (c) calibrate a linear X dependency of Ry on the basis of measurement of the rotation Ry with the X interferometer measurement system and measurement of the rotation Ry with the Z interferometer measurement system.

5. A lithographic apparatus comprising:
  (a) an object support configured to support an object;
  (b) an interferometer measurement system including an X interferometer measurement system configured to measure a position of said object support in an X direction of an XYZ coordinate system, a Y interferometer measurement system configured to measure a position of said object support in a Y direction of the XYZ coordinate system, and a Z interferometer measurement system configured to measure a position of said object support in a Z direction of the XYZ coordinate system;
  (c) an object support positioning system configured to position the object support in a number of degrees of freedom based on measurements of the interferometer measurement system; and
  (d) a calibration device configured to:
    (i) measure a rotation Rx of the object support about the X direction with the Y interferometer measurement system in at least two different Z positions;
    (ii) measure a rotation Rx of the object support about the X direction with the Z interferometer measurement system in at least two different Z positions;
    (iii) calibrate a linear Z dependency of Rx on the basis of measurement of the rotation Rx with the Y interferometer measurement system and measurement of the rotation Rx with the Z interferometer measurement system; and
    (iv) calibrate a linear Y dependency of Z on the basis of calibration of the linear Z dependency of Rx.

6. The apparatus of claim 5, wherein the calibration device is further configured to obtain a first parameter representing the linear Y dependency of Z by multiplying a second parameter representing the linear Z dependency of Rx with a factor.

7. The apparatus of claim 6, wherein the factor is L/2, wherein L is a dimension of the object support in the Y direction.

8. The lithographic apparatus of claim 5, wherein the calibration device is further configured to:
  (a) measure a rotation Rx of the object support about the X direction with the Y interferometer measurement system in at least two different Y positions;
  (b) measure a rotation Rx of the object support about the X direction with the Z interferometer measurement system in at least two different Y positions; and
  (c) calibrate a linear Y dependency of Rx on the basis of measurement of the rotation Rx with the Y interferometer measurement system and measurement of the rotation Rx with the Z interferometer measurement system.

9. A lithographic apparatus comprising:
  (a) an object support configured to support an object;
  (b) an interferometer measurement system including an X interferometer measurement system configured to measure a position of said object support in an X direction of an XYZ coordinate system, a Y interferometer measurement system configured to measure a position of said object support in a Y direction of the XYZ coordinate system, and a Z interferometer measurement system configured to measure a position of said object support in a Z direction of the XYZ coordinate system;
  (c) an object support positioning system configured to position the object support in a number of degrees of freedom based on measurements of the interferometer measurement system; and
  (d) a calibration device configured to:
    (i) measure a rotation Ry of the object support about the Y direction with a first device in at least two different Z positions;
    (ii) measure a rotation Ry of the object support about the Y direction with a second device comprising the Z interferometer measurement system in at least two different Z positions;
    (iii) calibrate a linear Z dependency of Ry on the basis of measurement of the rotation Ry of the object support about the Y direction in at least two different Z positions with the first device and measurement of the rotation Ry of the object support about the Y direction with the second device in at least two different Z positions; and
    (iv) calibrate a linear X dependency of Z on the basis of calibration of the linear Z dependency of Ry.

10. The apparatus of claim 9, wherein the first device includes a Z level sensor.

11. A method of calibrating a lithographic apparatus comprising: an object support configured to support an object; an interferometer measurement system including an X interferometer measurement system configured to measure a position of the object support in an X direction of an XYZ coordinate system, a Y interferometer measurement system configured to measure a position of the object support in a Y direction of the XYZ coordinate system, and a Z interferometer measurement system configured to measure a position of the object support in a Z direction of the XYZ coordinate system; and an object support positioning system configured to position the object support in a number of degrees of freedom based on measurements of the interferometer measurement system, the method comprising:

(a) measuring a rotation Ry of the object support about the Y direction with the X interferometer measurement system in at least two different Z positions;
(b) measuring a rotation Ry of the object support about the Y direction with the Z interferometer measurement system in at least two different Z positions;
(c) calibrating a linear Z dependency of Ry on the basis of said measuring of the rotation Ry with the X interferometer measurement system and said measuring of the rotation Ry with the Z interferometer measurement system;
(d) calibrating a linear X dependency of Z on the basis of said calibrating of the linear Z dependency of Ry; and
(e) supplying or making available a result of calibration of the linear X dependency of Z for further analysis or processing.

12. The method of claim 11, wherein calibrating said linear X dependency of Z includes determining a parameter representing said linear X dependency of Z by multiplying a parameter representing the linear Z dependency of Ry with a factor.

13. The method of claim 12, wherein the factor is L/2, wherein L is a dimension of the object support in the X direction.

14. The method of claim 11, further comprising:
(a) measuring a rotation Ry of the object support about the Y direction with the X interferometer measurement system in at least two different X positions;
(b) measuring a rotation Ry of the object support about the Y direction with the Z interferometer measurement system in at least two different X positions;
(c) calibrating a linear X dependency of Ry on the basis of said measuring of the rotation Ry with the X interferometer measurement system and said measuring of the rotation Ry with the Z interferometer measurement system.

15. A method of calibrating a lithographic apparatus comprising: an object support configured to support an object; an interferometer measurement system including an X interferometer measurement system configured to measure a position of the object support in an X direction of an XYZ coordinate system, a Y interferometer measurement system configured to measure a position of the object support in a Y direction of the XYZ coordinate system, and a Z interferometer measurement system configured to measure a position of the object support in a Z direction of the XYZ coordinate system; and an object support positioning system configured to position the object support in a number of degrees of freedom on the basis of measurements of the interferometer measurement system, the method comprising:
(a) measuring a rotation Rx of the object support about the X direction with the Y interferometer measurement system in at least two different Z positions;
(b) measuring a rotation Rx of the object support about the X direction with the Z interferometer measurement system in at least two different Z positions;
(c) calibrating a linear Z dependency of Rx on the basis of measurements of said measuring of the rotation Rx with the Y interferometer measurement system and said measuring of the rotation Rx with the Z interferometer measurement system;
(d) calibrating a linear Y dependency of Z on the basis of said calibrating of the linear Z dependency; and
(e) supplying or making available a result of calibration of the linear Y dependency of Z for further analysis or processing.

16. The method of claim 15, wherein calibrating said linear Y dependency of Z includes determining a parameter representing the linear Y dependency of Z by multiplying a parameter representing the linear Z dependency of Rx with a factor.

17. The method of claim 16, wherein the factor is L/2, wherein L is a dimension of the object support in the Y direction.

18. The method of claim 15, further comprising:
(a) measuring a rotation Rx of the object support about the X direction with the Y interferometer measurement system in at least two different Y positions;
(b) measuring a rotation Rx of the object support about the X direction with the Z interferometer measurement system in at least two different Y positions;
(c) calibrating a linear Y dependency of Rx on the basis of said measuring of the rotation Rx with the Y interferometer measurement system and said measuring of the rotation Rx with the Z interferometer measurement system.

* * * * *